United States Patent
Hammerschmidt et al.

(10) Patent No.: US 8,031,808 B2
(45) Date of Patent: Oct. 4, 2011

(54) MULTIPLE-BRANCH WIRELESS RECEIVER

(75) Inventors: Joachim S. Hammerschmidt, Bethlehem, PA (US); Danilo Manstretta, Laguna Niguel, CA (US)

(73) Assignee: Agere Systems Inc., Allentown, PA (US)

( * ) Notice: Subject to any disclaimer, the term of this patent is extended or adjusted under 35 U.S.C. 154(b) by 771 days.

(21) Appl. No.: 12/028,851

(22) Filed: Feb. 11, 2008

(65) Prior Publication Data
US 2008/0130773 A1     Jun. 5, 2008

Related U.S. Application Data

(63) Continuation of application No. 10/847,431, filed on May 17, 2004, now Pat. No. 7,356,322.

(51) Int. Cl.
*H03K 9/00* (2006.01)
(52) U.S. Cl. .......... 375/316; 346/37; 348/729; 370/203; 455/226.1; 455/226.2; 455/243.1
(58) Field of Classification Search .................. None
See application file for complete search history.

(56) References Cited

U.S. PATENT DOCUMENTS

| | | | |
|---|---|---|---|
| 5,933,770 A | 8/1999 | Heiter | |
| 6,134,430 A | 10/2000 | Younis et al. | 455/340 |
| 6,847,628 B1 | 1/2005 | Sakuma | |
| 6,871,052 B2 * | 3/2005 | Spencer et al. | 455/226.2 |
| 7,031,413 B2 | 4/2006 | Doi | 375/347 |
| 2003/0027538 A1 | 2/2003 | Masumoto et al. | |
| 2003/0220089 A1 | 11/2003 | Chang et al. | |
| 2004/0063412 A1 | 4/2004 | Kim et al. | |
| 2005/0141407 A1 * | 6/2005 | Sandhu | 370/203 |

FOREIGN PATENT DOCUMENTS

JP    2002314357    10/2002

OTHER PUBLICATIONS

Non-Final office action received in U.S. Appl. No. 10/847,431, filed May 17, 2004, dated Aug. 21, 2006.
Final office action received in U.S. Appl. No. 10/847,431, filed May 17, 2004, dated Feb. 22, 2007.

(Continued)

*Primary Examiner* — Dac Ha
*Assistant Examiner* — Adolf Dsouza
(74) *Attorney, Agent, or Firm* — Mendelsohn, Drucker & Assoc., P.C.; Kevin M. Drucker; Steve Mendelsohn

(57) ABSTRACT

A wireless receiver detects signals received at two or more antennas, with each antenna coupled to an input receive chain. A switch is employed to couple selected input receive chains to one or more corresponding output receive chains during listening, coarse-detection, and fine-adjustment modes. At least one channel selection filter (CSF) is employed in each output receive chain, and the receiver employs sub-ranging. During idle mode, one antenna's input receive chain is connected to two or more CSFs to detect the packet. When the packet is detected, during a coarse-adjustment mode, the CSFs are reconfigured to couple each antenna's input receive chain to a corresponding output receive chain using low-gain signals. During fine-adjustment mode, the various gains are adjusted to be either high- or low-gain to maintain signals within the dynamic range of the corresponding CSFs.

30 Claims, 13 Drawing Sheets

OTHER PUBLICATIONS

Advisory Action received in U.S. Appl. No. 10/847,431, filed May 17, 2004, dated May 16, 2007.
Non-Final office action received in U.S. Appl. No. 10/847,431, filed May 17, 2004, dated Jul. 26, 2007.
Notice of Allowability received in U.S. Appl. No. 10/847,431, filed May 17, 2004, dated Dec. 14, 2007.
Partial European Search Report from corresponding European Application No. EP 05253015; Mail Date: Mar. 31, 2011 (7 pages).
Japanese Examiner's Office Letter from corresponding Japanese Patent Application No. 2005-143567; Mail Date: Mar. 7, 2011 (9 pages).

* cited by examiner

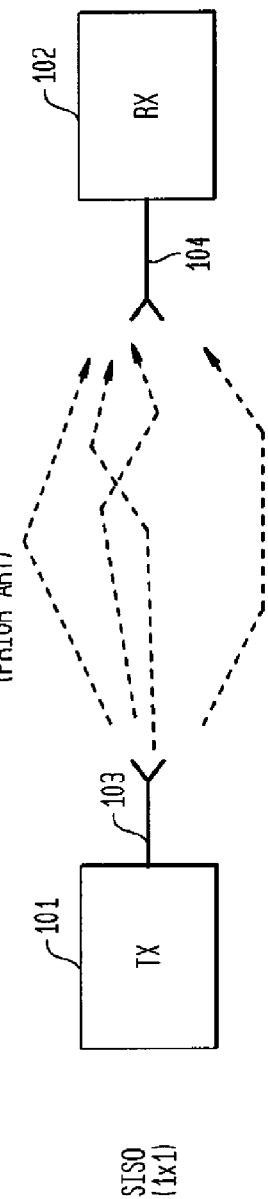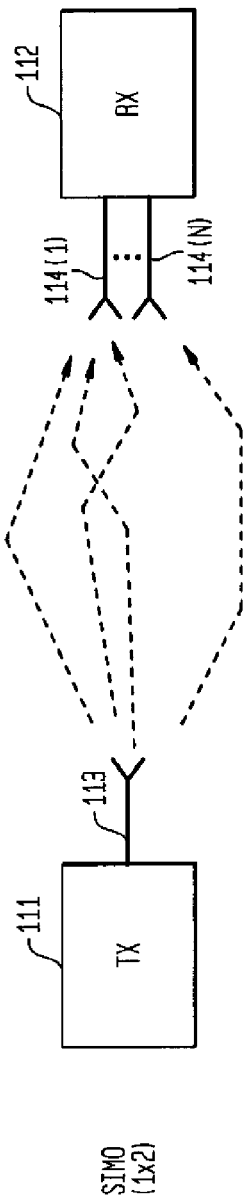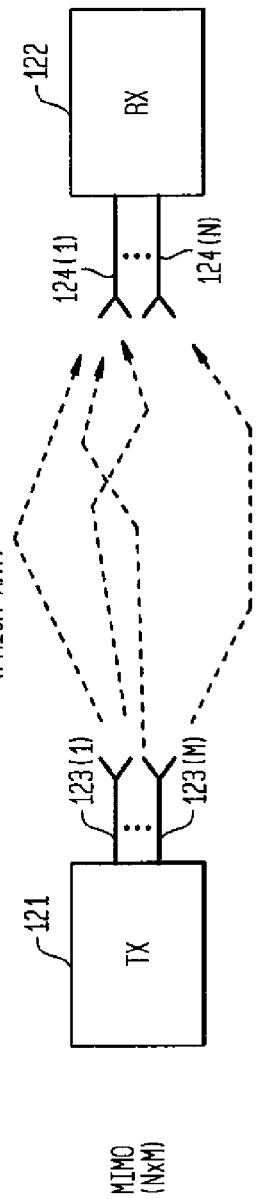

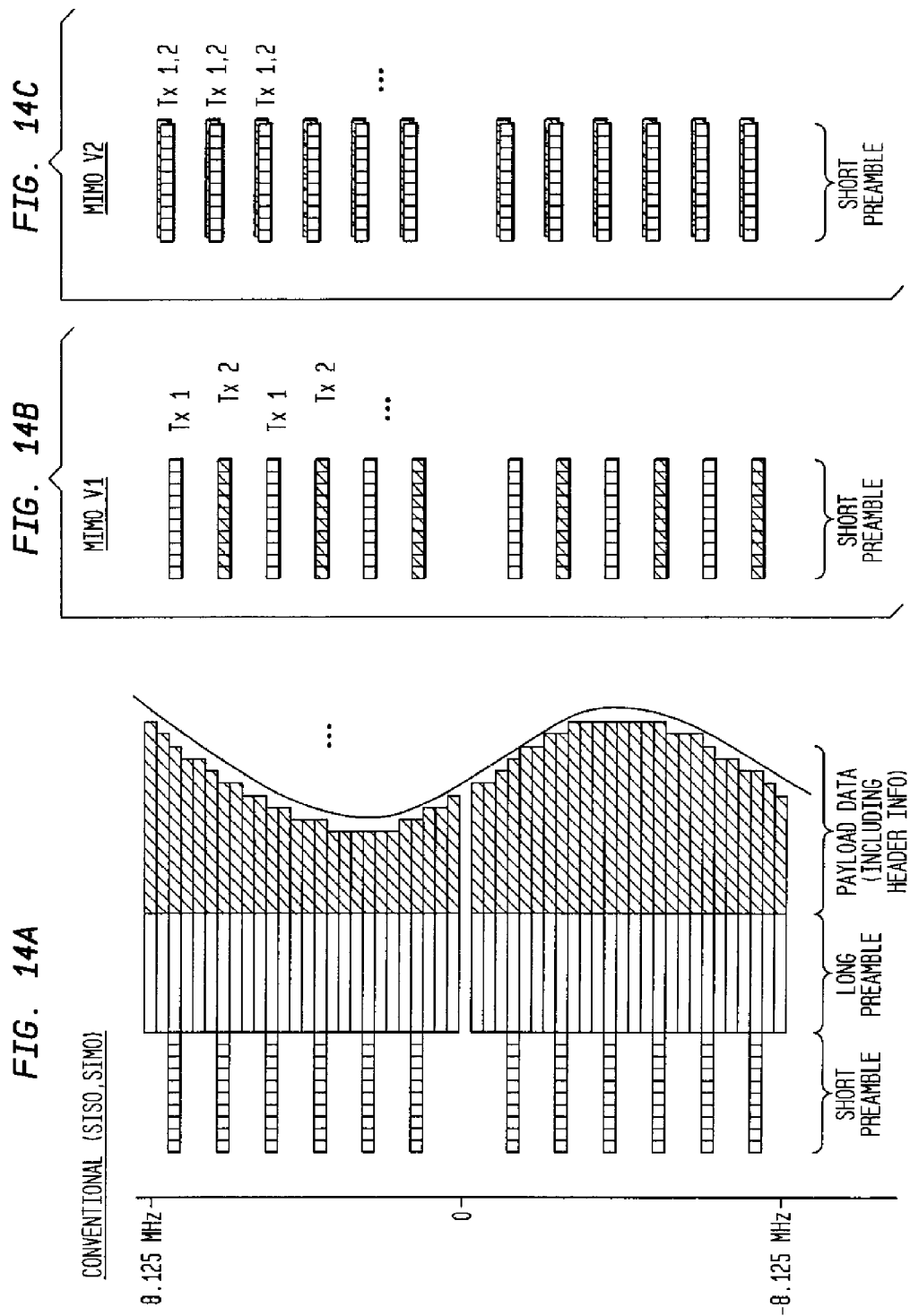

MULTIPLE-BRANCH WIRELESS RECEIVER

CROSS-REFERENCE TO RELATED APPLICATION

The present invention is a continuation of co-pending U.S. application Ser. No. 10/847,431 filed May 17, 2004.

BACKGROUND OF THE INVENTION

1. Field of the Invention

The present invention relates to communication systems, and, in particular, to a multiple-branch wireless receiver for multiple-antenna reception.

2. Description of the Related Art

Reliable and efficient transmission of information signals over imperfect communication channels is essential for wireless communication systems. One traditional transmission system of the prior art is illustrated in FIG. 1A in which transmitter 101 transmits, via a single antenna 103, a signal through a communication channel to a single antenna 104 of receiver 102. The signal is typically a carrier that has been modulated with data using any one of a number of different modulation techniques known in the art of communications. This type of transmission is also known as single input, single output (SISO) transmission. One characteristic of communication channels is multi-path distortion in which the transmitted signal energy is spread over several different signals, with each signal taking a slightly different period of time to reach its destination. Another characteristic of communication channels is fading and attenuation in which signal energy is lost. These communication channel characteristics contribute to signal degradation as the signal passes through the channel.

Another traditional transmission system of the prior art is shown in FIG. 1B in which transmitter 111 transmits, via a single antenna 113, a signal to receiver 112. However, receiver 112 includes 2 or more antennas 114(1) through 114(N). Each antenna detects a component of the transmitted signal, and diversity combining is used to combine the several received signals to reduce effects of signal degradation (e.g., false detection, missed detection, or bit errors). This type of transmission is also known as single input, multiple output (SIMO) transmission.

For SISO transmission, a receiver detects the transmitted signal from the communication channel and processes the received signal to extract the information. FIG. 2 shows front-end portion 200 of a SISO receiver of the prior art. The circuitry, or "receive chain," used to translate the detected signal to baseband (BB) typically includes antenna 201 to detect the signal, filter 202 to bandpass the detected signal and filter out noise, low-noise amplifier 203 to amplify the detected signal, and mixer 204 to demodulate the signal from the carrier to BB (or near-BB). Front-end portion 200 further includes variable gain amplifier 205 to adjust the gain of the demodulated signal for filtering, filter 206 to bandpass the baseband signal, variable gain amplifier 207 to adjust the gain of the bandpass signal for sampling, and analog-to-digital converter (ADC) 208 to generate digital samples of the bandpass signal for processing by digital signal processor (DSP) 210. For SIMO transmission, a receive chain might be used similar to that shown in FIG. 2, though modified to account for delay and the combination of the several received signals. Alternatively, several different receive chains might be used, with the DSP implementing the signal combination.

For MIMO transmission, as illustrated in FIG. 1C, a transmitted sends separate signals on two or more transmit antennas, the separately transmitted signals are combined as they pass through the channel, and the receiver receives the combined signals on each of two or more receive antennas. The receiver detects and demodulates each of the transmitted signals and processes the received signals to extract the information. FIG. 3 shows MIMO receiver 300 having receive chains 301(1) through 301(N) detecting, demodulating, and sampling corresponding ones of the transmitted carrier signals for processing by DSP 302. The duplicated circuitry, or receive chains, required to translate each carrier signal to BB is termed a "multiple-branch" (or "multiple-chain") receiver.

Referring to receive chain 301(1) of FIG. 3, bandfilter (BF) 310(1) limits the frequency spectrum of the signal from the antenna to the desired band (e.g., the Wireless LAN band, or cellular band) which might have up to several 100 MHz of bandwidth. Low-noise Amplifier (LNA) 311(1) is employed as a first amplification stage for low-power filtered signals (e.g., in the pWatt range) from antenna 302(1). LNA 311(1) might be gain-adjustable (e.g., a high- and a low-gain mode) to capture both very low as well as very large signals. Mixer 312(1) translates, in frequency, the input signal from LNA 311(1) from its RF carrier down to a much lower frequency (i.e., to an intermediate frequency (IF) or to BB). For receive chain 301(1), mixer 312(1) translates the input signal either directly to BB ("Zero IF, ZIF" or "Direct Conversion") or to a "low IF" (LIF) frequency band not far from BB. Receive chains of other MIMO receivers of the prior art might comprise two or more mixing and IF stages. Receive chains through 301(N) operate in a manner analogous to that described above for receive chain 301(1).

First programmable gain amplifier (PGA) 313(1) pre-adjusts the BB or low-IF signal level from mixer 312(1) for channel selection filter (CSF) 314(1), since CSF 314(1) covers a certain range of signal levels. Signal-level pre-adjustment by PGA 313(1) prevents the output signal from mixer 312(1) from being so low it disappears into the noise floor or from being so high it saturates the filter circuitry. In addition, PGA 313(1) adjusts the gain of the signal that is applied to CSF 314(1) so that the signal is within the dynamic range of CSF 314(1), allowing for linear operation of CSF 314(1). While not explicitly shown in FIG. 3, signals from mixer 312(1) are typically complex valued (i.e., having in-phase and quadrature components), such that each component in the chain has two physical inputs as well as two physical outputs.

CSF 314(1) filters the signal from mixer 312(1) so as to pass the desired information channel, which, for example, in Wireless LANs operating according to the IEEE 802.11a/g OFDM standards has a bandwidth of approximately 20 MHz (e.g., typically 16-17 MHz). CSF 314(1) might have a passband width that is wider than that of the desired information channel, with subsequent filtering to the BB signal typically performed in the digital domain by DSP 302. Second PGA 315(1) adjusts the signal level to be within the range supported by analog-to-digital converter (ADC) 316(1). ADC 316(1) periodically time-samples the signal from PGA 315(1) into quantized levels. In Wireless LANs operating according to the IEEE 802.11a/g OFDM standards, a typical sampling period is 50 ns (i.e., corresponding to a sampling frequency of 20 Msps (Mega samples per second)). DSP 302 then processes the sample sequence from ADC 316(1), along with sample sequences from ADCs 316(2) through 316(N).

One successful approach to achieving reliable transmission is multi-carrier modulation (MCM). MCM is a modulation technique that might employ several transmit antennas at the transmitter. The principle of MCM is to divide a communication channel into a number of sub-carriers (also called tones or bins), with each sub-carrier independently modulated. Information is modulated onto a tone by varying the tone's phase, amplitude, or both. Each modulated tone is then transmitted through the communication channel, usually via a separate or corresponding antenna.

Orthogonal frequency division multiplexing (OFDM) is a form of MCM in which tone spacing is selected such that each tone is orthogonal to all other tones. OFDM wireless local area network (wireless LAN or WLAN) systems are typically designed to conform to either a contention-based wireless medium access standard such as IEEE 802.11 or a scheduled time-division duplex (TDD) wireless medium access standard such as European Telecommunications Standards Institute (ETSI) HIPERLAN/2. In a WLAN system conforming to a contention-based standard, OFDM stations compete for access to the wireless medium using "fair contention" medium-sharing mechanisms specified in the standard. In contrast, medium access in a scheduled TDD-conforming WLAN system is controlled by a single designated station, which schedules medium access for all other transceivers.

IEEE Standard 802.11 and its extensions 802.11a/b/g specify the physical layers and medium access control procedures for OFDM WLAN systems. For example, an 802.11a-compliant system operates in the 5-GHz radio-frequency band and provides data communication capabilities of 6, 9, 12, 18, 24, 36, 48, and 54 Mbit/s. The system uses 52 tones (numbered from −26 to 26, excluding 0) that are modulated using binary or quadrature phase shift keying (BPSK/QPSK), 16-quadrature amplitude modulation (QAM), or 64-QAM. In addition, the system employs forward error correction (convolutional) coding with a coding rate of ½, ⅔, or ¾.

In a WLAN system operating according to the 802.11a/g standard, each station (i.e., a transceiver that is either an access point or a client) continuously monitors the communication channel (i.e., the wireless radio medium). Since the access protocol is "random", the receiver of a listening station does not know when the next data packet will arrive and at what power level the packet will arrive. Therefore, the receiver detects and adjusts the signal level of an incoming packet over a relatively large signal power range (i.e., when the incoming packet has very small signal power as well as very high power). Signal power is typically measured in dBm, which is the logarithmic value 10 Log 10 (P/mW) [dBm], where P/mW is the received signal power P (measured at the antenna) normalized to 1 mW.

In WLAN systems, a typical power-level range that is covered by the receiver may be between approximately −20 dBm (=10 µW), for very strong signals from nearby transmitters and −90 dBm (=1 nW) for very weak signals from remote transmitters. This power-level range is referred to as the WLAN system's dynamic range.

In general, the dynamic range of a system, or block, is the range of signal levels at the input of the block for which, at the output of the block, the desired signal is neither hidden in the noise floor, nor saturated, as illustrated on FIG. 4. Due to thermal noise processes, every block has a certain noise level at its output. The input signal level that corresponds to the output level at the noise floor is the smallest detectable signal. The diagonal line in FIG. 4 denotes an ideal input-output signal relationship for linear operation. If the input signal level is smaller than $min_{in}$, the corresponding output signal level is masked by the noise floor at the output. On the other hand, since a block has a limited maximum output level (e.g., due to the power supply voltage), at a certain point an increase of the input level does have a corresponding linear increase at the output. At this point the output signal of the block is "distorted" (the output signal level "clips" or "saturates").

The point $max_{in}$ up to which the input signal does not cause the output level to clip is the upper end of the dynamic range; very often this point is characterized as the 1 dB compression point, at which the output is 1 dB less than the ideal value.

Whenever the input signal level is outside the block's dynamic range, the output signal is often no longer useful for further processing since the overall output signal is either heavily noise- or distortion-dominated. A circuit having a relatively large dynamic range generally requires complex circuitry typically occupying a relatively large (IC) chip area and exhibiting relatively large power consumption. Large dynamic range generally requires complex circuitry because more complicated and more powerful analog processing is required to maintain i) a relatively small noise level and ii) a relatively linear input-to-output relationship from low to high input signal levels. Therefore, a given implementation typically attempts to maintain the dynamic range of each block (e.g., a receive chain) at a minimum.

In a given implementation of a multiple-branch receiver, duplicating several receiver chains is expensive and requires substantial operating power. In particular, the channel selection filter, which passes the desired MCM signal from the antenna, typically occupies substantial area of the IC chip and consumes a large percentage of the operating power. Therefore, simple duplication of the channel selection filter is very undesirable in the design of a multiple-branch receiver. Unfortunately, each channel selection filter covers a large dynamic range to pass very strong signal levels from a nearby transmitter as well as very weak signals from remote transmitters, such as is typical for wireless local area networks.

Dynamic range of a block is very important for detection of a WLAN packet. Whatever signal level an arriving packet has when the receiver is in idle mode, the receive chain desirably does not mask or clip the desired signal. Masking or clipping of the output signal of a block results in failed packet detection. Packet detection is commonly accomplished by measuring certain properties of the desired signal. For example, autocorrelation properties of the packet's preamble (that is, a known "header" or training sequence transmitted at the beginning of the packet before the actual data starts) are measured with a correlator to detect the presence or absence of a packet.

A "received signal strength indication" (RSSI) module is an analog power measurement circuit that performs a square and time-average (by, e.g., low-pass filtering) of the signal input to the RSSI module. Depending on the time-constant of the low-pass filter, the output of the RSSI module is a short-term indication of the signal level sensed at the input of the RSSI module. An RSSI module is employed at various stages in an analog circuit to enable gain adjustment. If the output signal of a given circuit block ("block under test" or BuT) is monitored by an RSSI module, the RSSI module produces a relatively fine estimate of the sensed signal power. Using the estimate of sensed output signal power and the known gain of a given BuT, the input power to the BuT might be calculated, provided the BuT operates within its dynamic range. Otherwise, the RSSI level indicated by the RSSI module is a value close to the noise power level or the saturation level.

A simple RSSI measurement, such as shown in FIG. 4, uses three quantized RSSI levels. The three RSSI levels are: "Below Threshold" (BT), "Linear Range" (LIN), and "Clipped" (CL). BT indicates that the signal is very small, typically masked by the noise floor. LIN indicates the range of signals in which the BuT operates linearly (i.e., within the BuT dynamic range), and CL indicates when the signal is greater than a certain threshold (indicating, e.g., saturation of the BuT).

FIG. 5 shows format of packet 500 defined for a system operating in accordance with WLAN 802.11a/g OFDM. Packet 500 includes short preamble 501, long preamble 502, and data 503. Short preamble 501 is used by a receiver to detect a packet (i.e., to distinguish it from noise or other interference that might be present on the channel) and adjust gain settings. Long preamble 502 is used to estimate other parameters and variables such as the frequency offset, symbol and sample timing, and propagation channel characteristics (e.g., impulse response or transfer function).

Short preamble 501 is periodic. For example, the short preamble may be periodic in that the same signal repeats every 0.8 µs, with 10 repetitions. This periodicity of short preamble 501 is commonly used for a correlation operation on the signal. The correlation operation is an auto-correlation that i) delays the signal from the antenna by multiples of 0.8 µs and ii) compares (correlates) the delayed signal with the non-delayed signal. If there is a strong correlation, this suggests that there is an 802.11a/g OFDM-compliant preamble such that the overall reception process needs to be started. In a high-data-rate MIMO system with, for example, two transmit antennas and two receive antennas, a distinguishable MIMO preamble is transmitted by each of the two antennas.

Either RSSI-level indication or correlation might be used to detect the start of a received packet, but RSSI-level indication and correlation exhibit different performance depending on the signals that are received from the antenna. For example, if there are various "rogue" signals in the channel, such as non-WLAN microwave or cordless phone signals, an RSSI-level indication might erroneously suggest the start of a received packet, leading to false detection/alarm. If, on the other hand, correlation is used, unless the signal exhibits the desired periodicity, false detection is unlikely.

Another technique of the prior art for radio signal reception from a single receiver antenna is a sub-ranging radio architecture. As described above for the MIMO system of FIG. 3, a programmable gain amplifier (e.g., amplifier 313(1)) is employed before filtering (by, e.g., filter 314(1)) to scale the signal to the allowable range (dynamic range). Under steady-state conditions (e.g., assuming the input power level is known), this scaling might be accomplished relatively accurately. However, the actual signal power and corresponding pre-amplified level of an incoming packet at the stage after initial gain adjustment (by, e.g., amplifier 311(1)) cannot be predicted. Consequently, during idle mode to detect the start of a packet preamble, the gains of the various amplifiers are set relatively high ("sensitive") in order to ensure reception of packets with relatively weak signal levels.

However, due to the limited dynamic range of the channel selection filter, clipping might occur if the input signal is very strong. To avoid clipping, a sub-ranging radio architecture might be employed. FIG. 6 shows a prior-art sub-ranging radio receiver 600 including BF 601 to band-filter the received signal from antenna 610, LNA 602 to amplify the band-filtered signal, and mixer 603 to demodulate the amplified, band-filtered signal to BB. However, sub-ranging radio receiver 600 further includes two sub-chains 604 and 605. Sub-chain 604 includes amplifiers 607 coupled to corresponding CSF 606, and sub-chain 605 includes amplifier 609 coupled to corresponding CSF 608.

Each of sub-chains 604 and 605 is configured such that each block (amplifier and CSF) operates in a linear range for a given level of the BB signal from mixer 603. For example, one sub-chain amplifier might have relatively low gain, while the other sub-chain amplifier has relatively high gain. In the conventional receiver with one or more receive chains each covering the input signal, a relatively wide dynamic range might be required for the post-mixing channel selection filter, but when sub-ranging is employed, receive sub-chains share the overall dynamic range between each other. Consequently, each of filters 606 and 608 is relatively i) small in terms of IC chip area, ii) less complex in terms of circuit design, and iii) low-power in comparison to the post-mixing filter of, for example, 314(1) of the MIMO receiver of FIG. 3. FIG. 7 illustrates the comparison between dynamic range of a conventional architecture receiver and each sub-chain of a sub-ranging receiver.

SUMMARY OF THE INVENTION

In accordance with embodiments of the present invention, a wireless receiver detects a signal from two or more antennas, with each antenna coupled to a radio front end. A switch is employed to couple selected radio front ends to one or more corresponding output receive chains during listening, coarse-detection, and fine-adjustment modes. One channel selection filter (CSF) is employed in each output receive chain, and the receiver employs sub-ranging. During idle mode, one antenna's radio front end is connected to two or more CSFs to detect the packet. When the packet is detected, the CSFs are reconfigured during a coarse adjustment mode to couple each antenna's radio front end to a corresponding output receive chain's CSF using low-gain signals. During fine-adjustment mode, the various gains are adjusted to be either, e.g., high- or low-gain to maintain signals within the dynamic range of the corresponding CSFs.

In accordance with an exemplary embodiment of the present invention, a receiver includes two or more radio front ends, each radio front end adapted to generate first-gain and second-gain output signals from a corresponding one of the plurality of received signals; and two or more channel selection filters (CSFs), each CSF adapted to filter either the first-gain output signal or the second-gain output signal to pass a corresponding information channel signal. A detector coupled to each of the corresponding ones of the channel selection filters detects a presence of a data pattern. A switch selectively couples one or more of the first-gain and second-gain output signals of the two or more radio front ends to one or more corresponding CSFs based on the detected presence or absence of the data pattern.

BRIEF DESCRIPTION OF THE DRAWINGS

Other aspects, features, and advantages of the present invention will become more fully apparent from the following detailed description, the appended claims, and the accompanying drawings in which:

FIG. 1A shows a single input, single output (SISO) transmission system of the prior art;

FIG. 1B shows a single input, multiple output (SIMO) transmission system of the prior art;

FIG. 1C shows a multiple input, multiple output (MIMO) transmission system of the prior art;

FIG. 14A shows a preamble format as employed for the receiver of FIG. 9 in either a SISO or SIMO transmission system;

FIG. 14B shows a first alternative preamble format as employed for the receiver of FIG. 9 in a MIMO transmission system; and FIG. 14C shows a second alternative preamble format as employed for the receiver of FIG. 9 in a MIMO transmission system.

DETAILED DESCRIPTION

Figure 8:
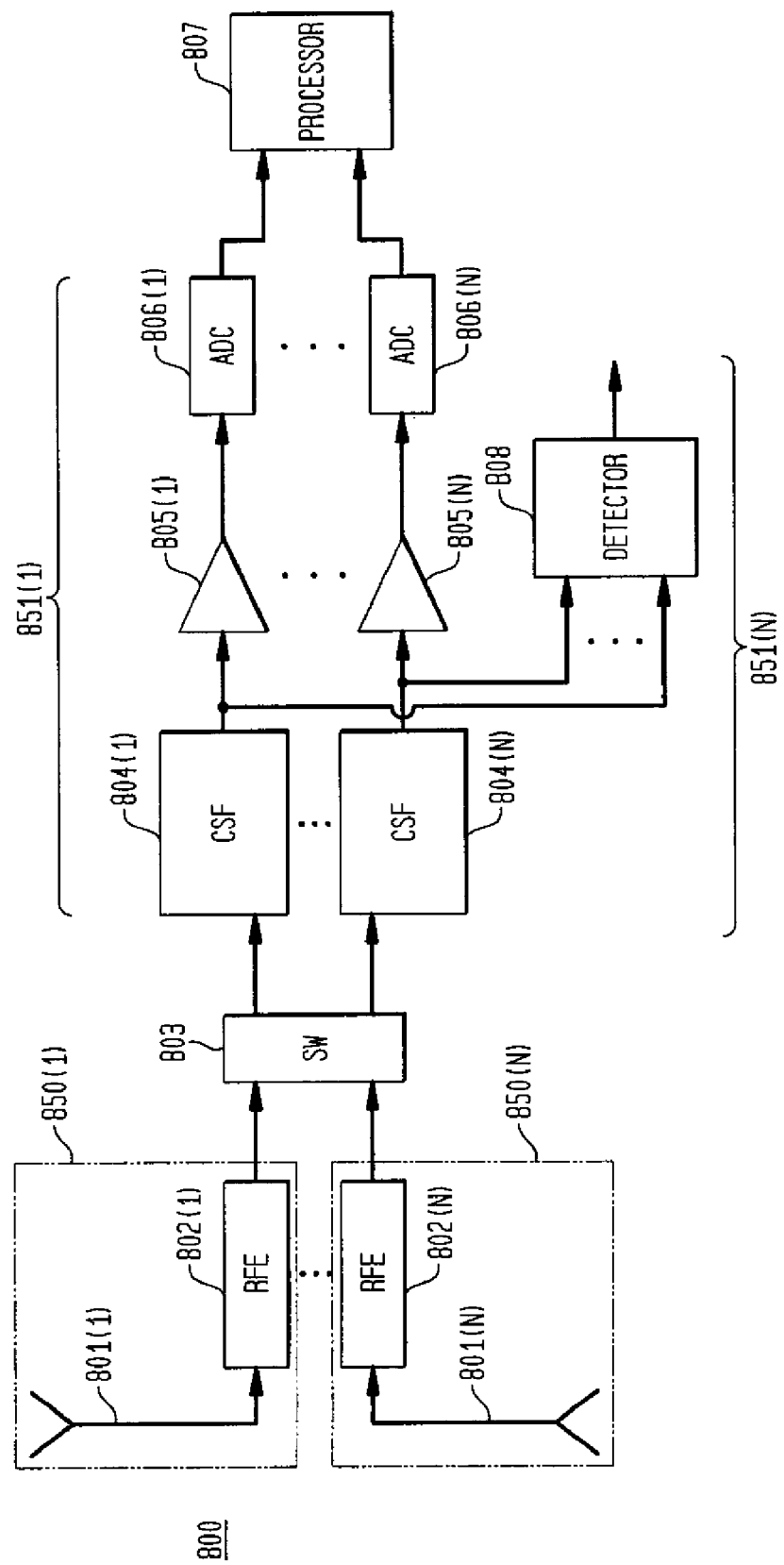
FIG. 8 shows a block diagram of a receiver operating in accordance with an exemplary embodiment of the present invention.

FIG. 8 shows a multiple input, multiple output (MIMO) receiver 800 operating in accordance with exemplary embodiments of the present invention. Receiver 800 comprises antennas 801(1) through 801(N) with N a positive integer greater than 1, radio front ends (RFEs) 802(1) through 802(N), switch (SW) 803, channel selection filters (CSFs) 804(1) through 804(N), programmable amplifiers (PGAs) 805(1) through 805(N), analog-to-digital converters (ADCs) 806(1) through 806(N), processor 807, and detector 808. RFE 802(n) receives the nth signal from antenna 801(n), band-filters and gain adjusts the nth antenna signal, and demodulates the nth antenna signal to base-band (BB) or near-BB.

CSF 804(n) filters the signal from a selected one of RFEs 802(1) through 802(N) so as to pass the desired information channel. For example, one or more of CSFs 804(1) through 804(N) might be configured to operate for a WLAN according to the IEEE 802.11a/g standards for orthogonal frequency division multiplex (OFDM). For such configuration, one or more of CSFs 804(1) through 804(N) has a bandwidth of approximately 20 MHz. CSF 804(n) might have a pass-band width wider than that of the desired information channel of the nth channel, with subsequent filtering to the digital base-band performed in the digital domain by processor 807. PGA 805(n) adjusts the signal from CSF 804(n) to be within the range supported by ADC 806(n). ADC 806(n) periodically time-samples the signal from PGA 805(n) into quantized levels.

Consequently, receiver 800 comprises a set of N input receive chains 850(1) through 850(N), where the nth input receive chain comprises antenna 801(n) and RFE 802(n). Receiver 800 further comprises N output receive chains 851(1) through 851(N), where the nth output receive chain comprises filter 804(n), PGA 805(n), and ADC 806(n). N input receive chains 850(1) through 850(n) and N output receive chains 851(1) through 851(N) are interconnected via SW 803.

Output receive chains 851(1) through 851(N) are each monitored by detector 808 to detect the presence of a packet prior to gain adjustment by a corresponding one of PGAs 805(1) through 805(N). The output of each of ADC 806(1) through 806(N) is applied to processor 807 for subsequent processing and decoding.

Receiver 800 operates in one of at least four modes: idle mode, coarse-adjustment mode, fine-adjustment mode, and reception mode. Detector 808 and SW 803 are employed to determine which of the four modes receiver 800 currently operates in. During each mode, gains in each of the N receive chains are set to a corresponding sensitivity. The sensitivities in each of the N chains allow receiver 800 to operate in a sub-ranging manner to minimize the required dynamic range of CSFs 804(1) through 804(N).

For the following exemplary embodiment, the present invention is described with respect to dual-antenna (N=2) receiver, though one skilled in the art might readily extend the teachings herein to a larger number of antenna paths. While the preferred embodiments described herein might be employed for a system operating in accordance with an IEEE Standard 802.11 and its extensions 802.11a/b/g for OFDM WLAN systems, the present invention is not so limited. One skilled in the art might extend the present invention to other types of SIMO or MIMO receivers or other types of multiple-antenna radio receivers (such as cellular telephony/data systems, entertainment short-range communication systems, and ranging systems). In addition, the circuit configurations shown and described herein are exemplary, and one skilled in the art might employ different configurations that operate in accordance with the teachings herein.

Figure 9:
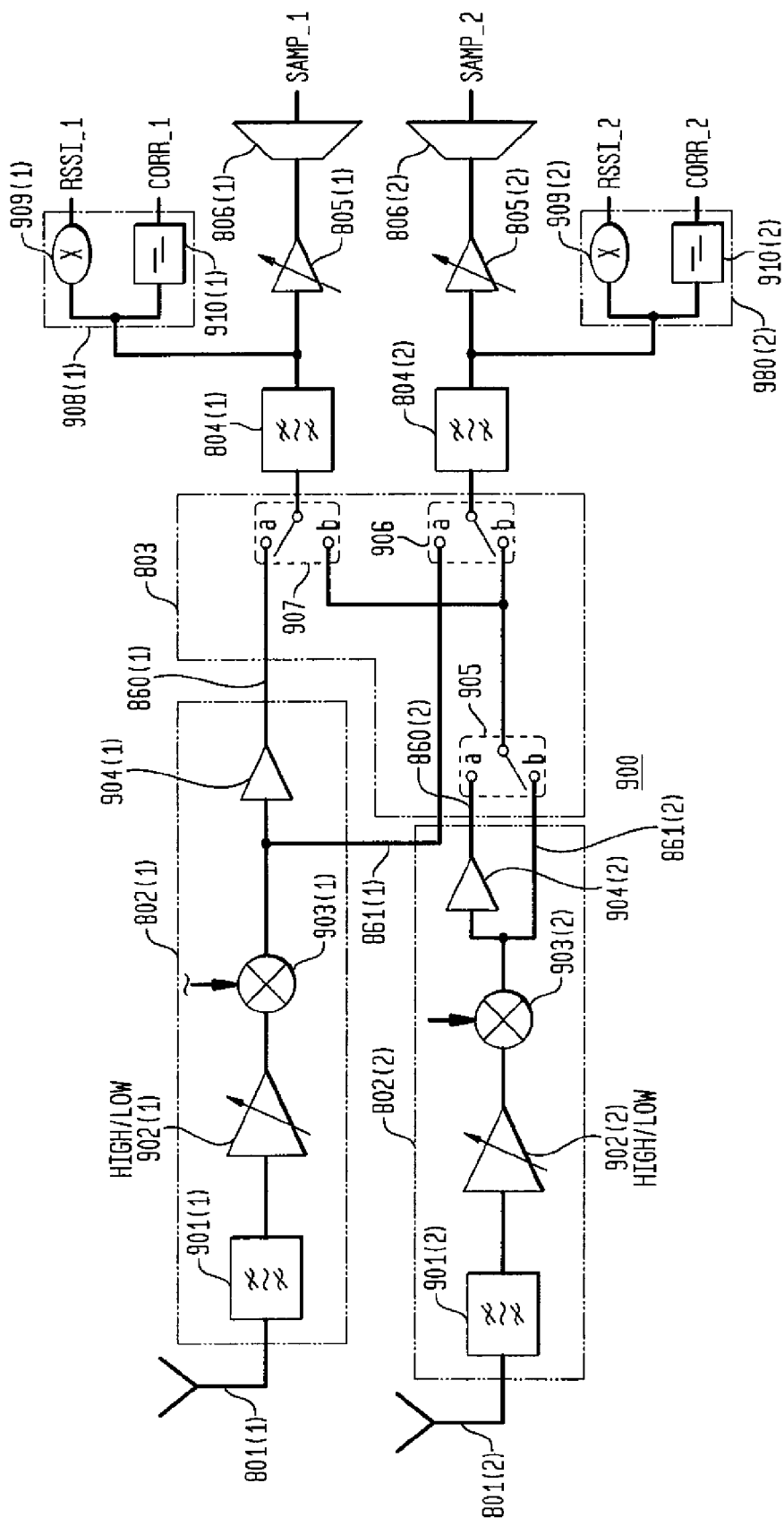
FIG. 9 shows an exemplary embodiment of the receiver of FIG. 8 having a dual-antenna configuration.

FIG. 9 shows dual-antenna receiver 900 operating in accordance with an exemplary embodiment of the present invention. Receiver 900 comprises two antennas 801(1) and 801(2) receiving signals from a communication channel. RFE 802(n), n=1.2, comprises band-pass filter (BPF) 901(n), variable-gain low-noise amplifier (LNA) 902(n), mixer 903(n), and sub-ranging amplifier (SRA) 904(n). SW 803 comprises switches 905, 906, and 907. Detector 808 comprises two packet detectors (PDs) 908(1) and 908(2), where PD 908(n) includes received signal strength indication module (RSSIM) 909(n) and correlator (CORR) 910(n).

RFE 802(n) has two outputs corresponding to high-gain sub-branch 860(n) and low-gain sub-branch 861(n), where high-gain sub-branch 860(n) includes sub-ranging gain adjustment (e.g., by SRA 904(1) or SRA 904(2)) and low-gain sub-branch 861(n) exhibits no gain adjustment. In addition, mixers 903(1) and 903(2) each demodulate the corresponding input signal to BB or near-BB, and the output signals of mixers 903(1) and 903(2) are typically complex signals (signals having in-phase and quadrature-phase components) depending on the actual frequency conversion performed by the mixer. Consequently, while not expressly shown in the FIGs., signals might be complex-valued. In addition, the input signal power and amplifier gain levels described herein are exemplary, and might vary depending on a given implementation.

Figure 2:
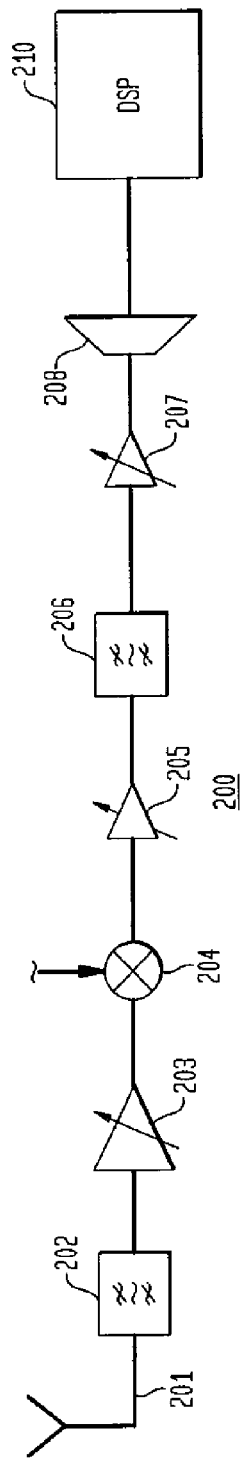
FIG. 2 shows a prior-art receiver of a SISO transmission system.
Figure 3:
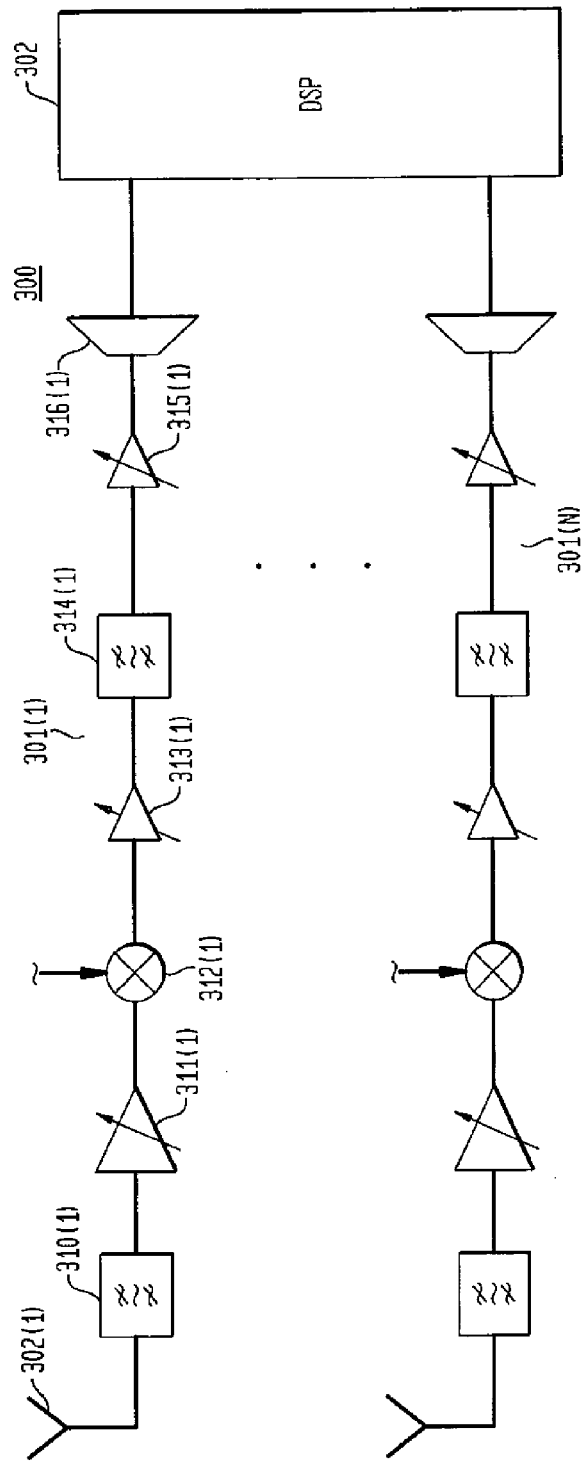
FIG. 3 shows a prior-art receiver of either a SIMO or MIMO transmission system.
Figure 4:
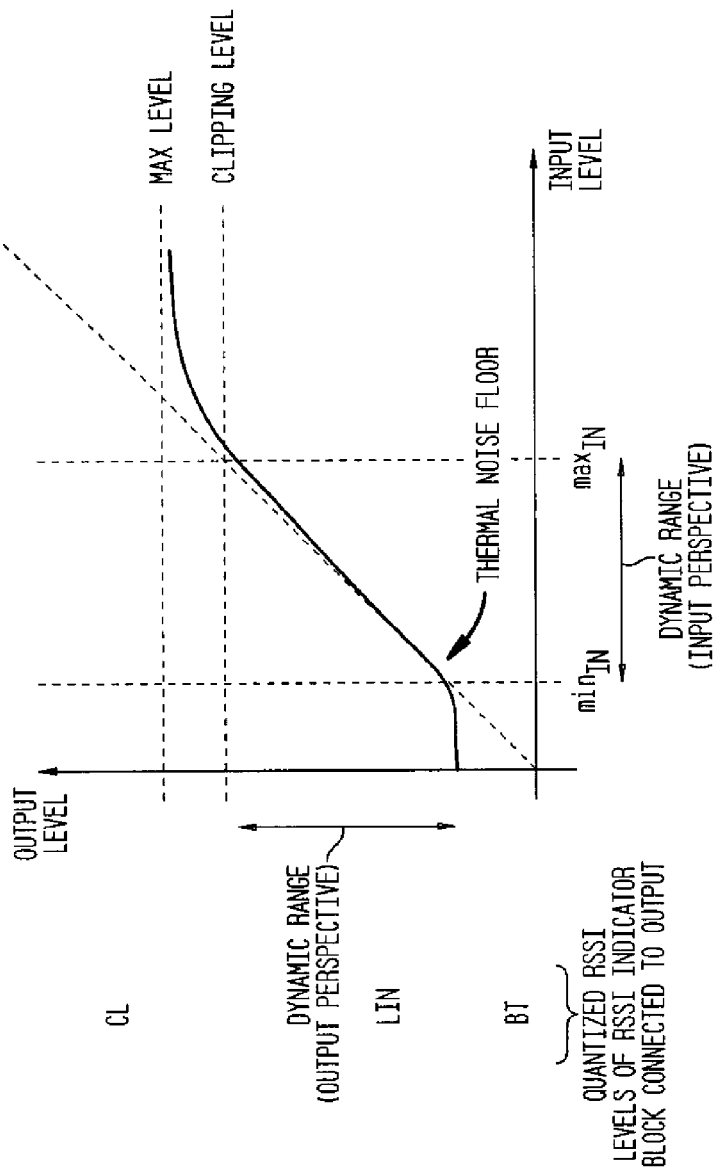
FIG. 4 illustrates dynamic range of a filter that may be employed by the prior-art receivers of FIGS. 2 and 3.
Figure 5:
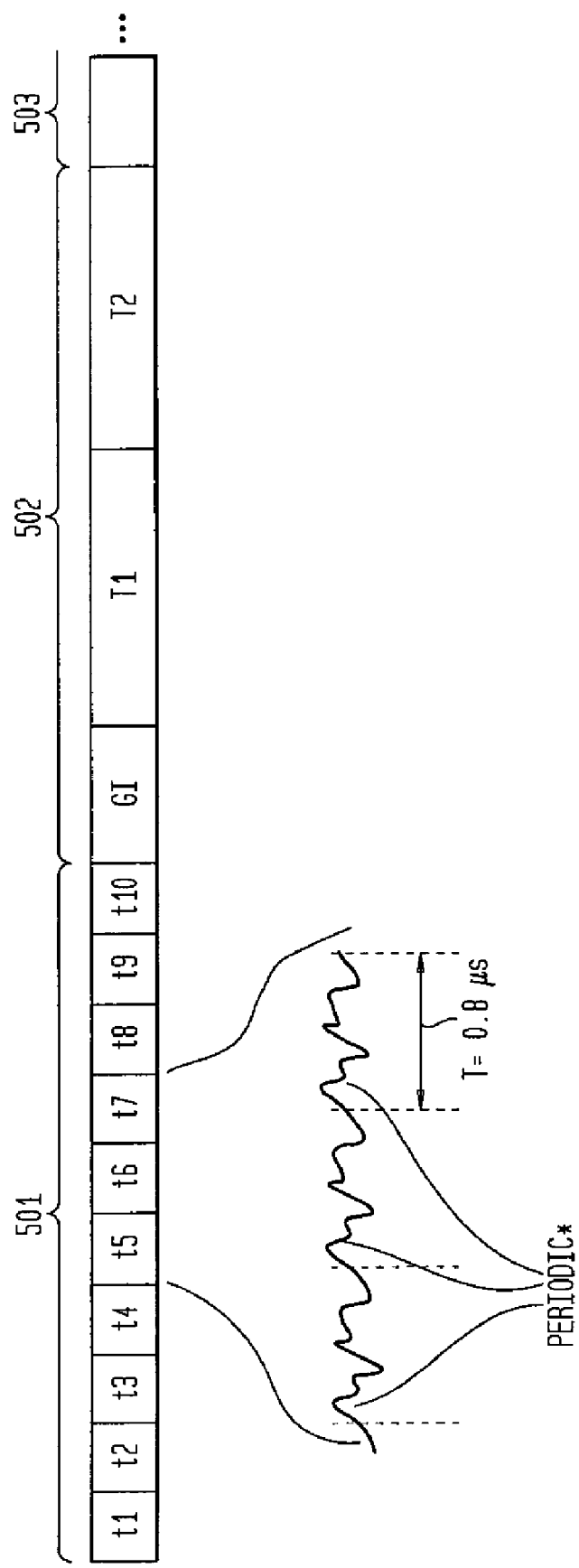
FIG. 5 shows a format of packet for a prior-art system operating in accordance with a wireless local area network (WLAN) standard.
Figure 6:
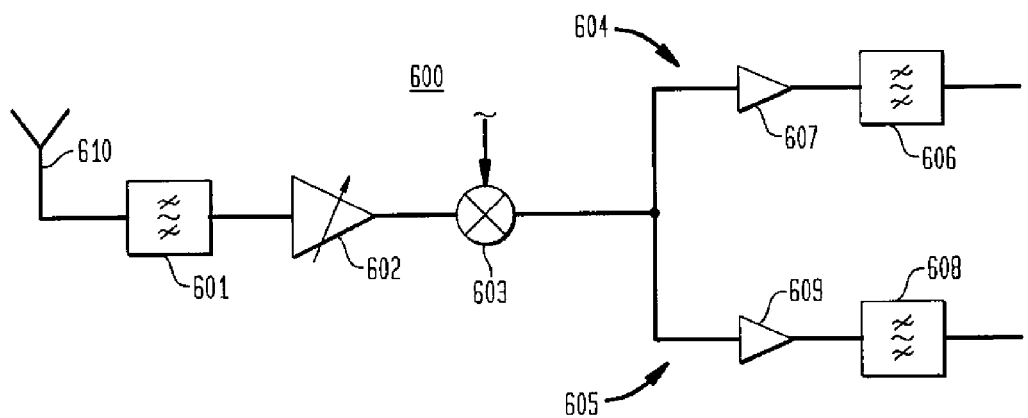
FIG. 6 shows a prior-art sub-ranging radio receiver as may be employed by a SISO system receiver.
Figure 7:
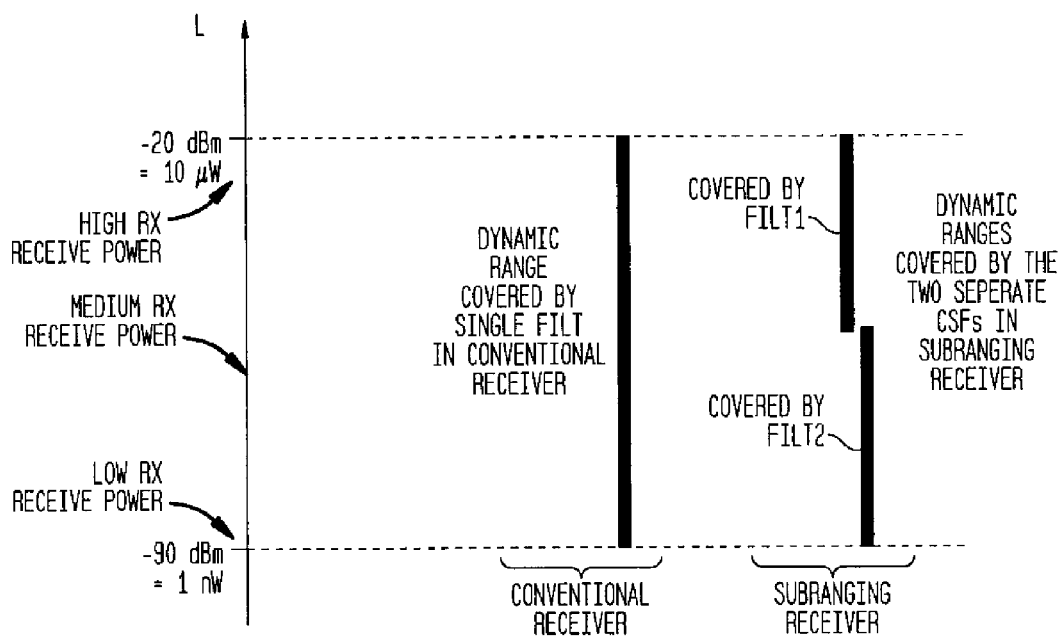
FIG. 7 illustrates the comparison between dynamic range of a channel selection filter of prior-art conventional and sub-ranging receivers.
Figure 10A:
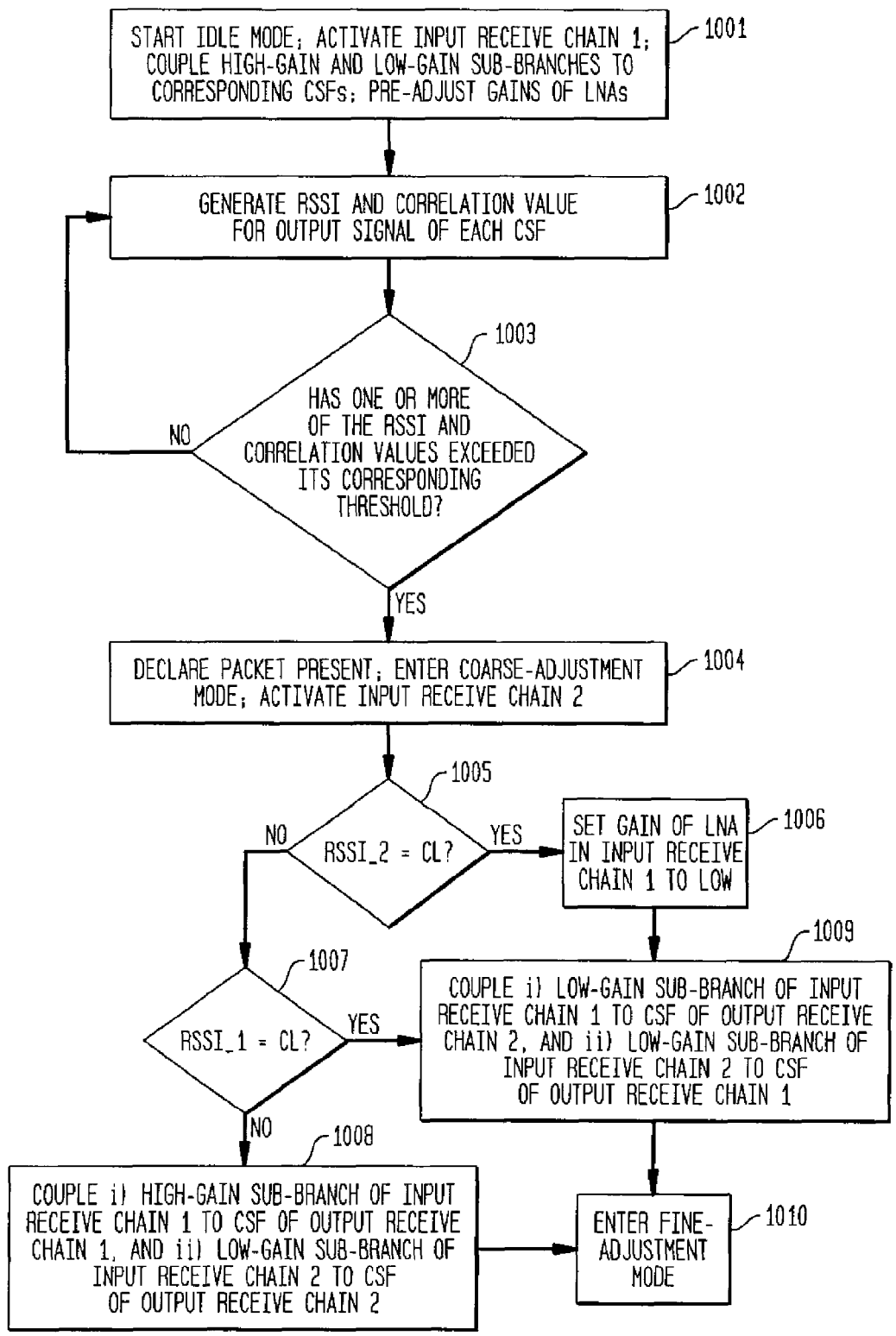
FIG. 10A shows a first portion of a method of adjustment for the exemplary embodiment of FIG. 9.
Figure 10B:
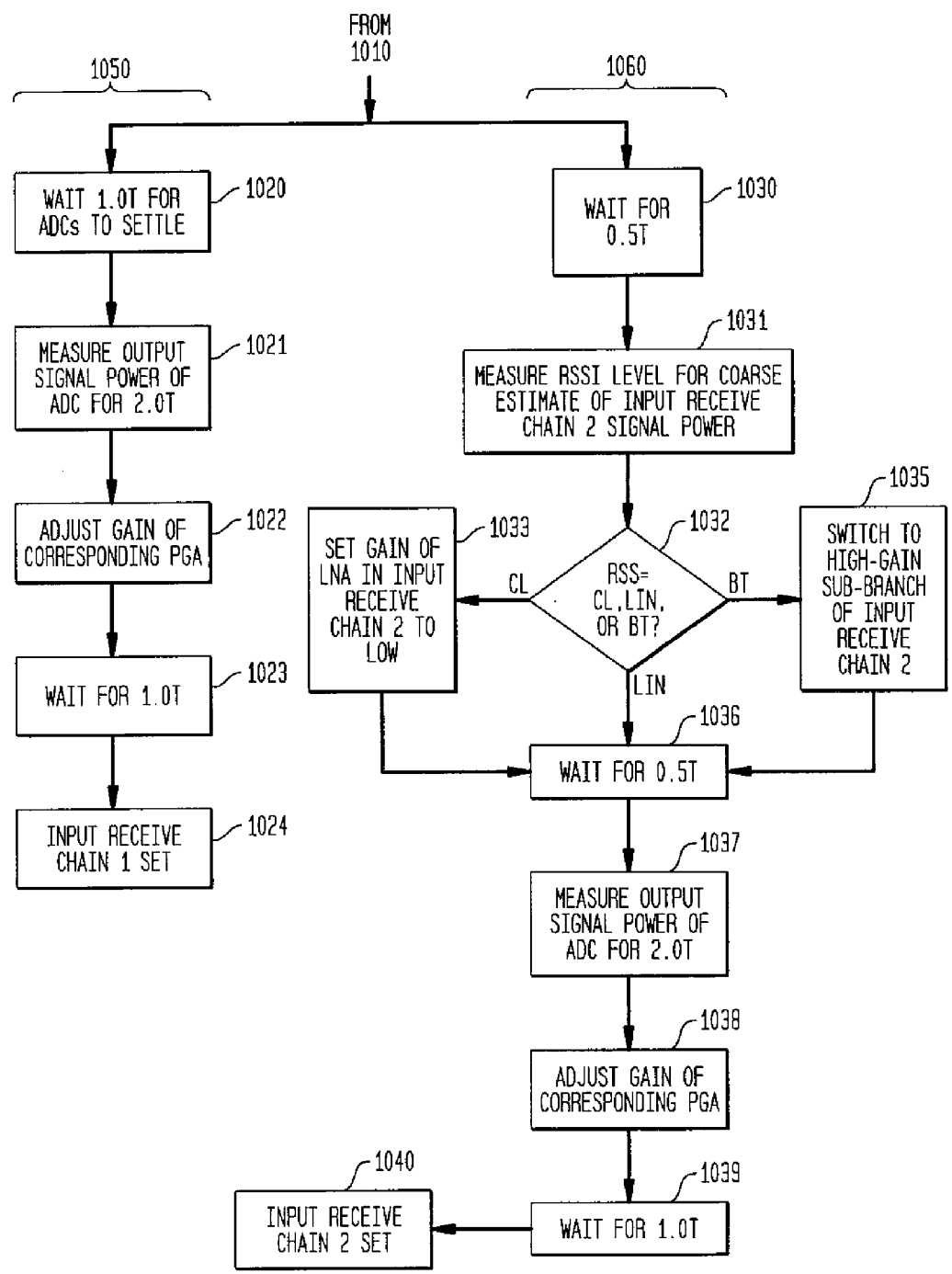
FIG. 10B shows a second portion of the method of adjustment for the exemplary embodiment of FIG. 9.
Figure 11:
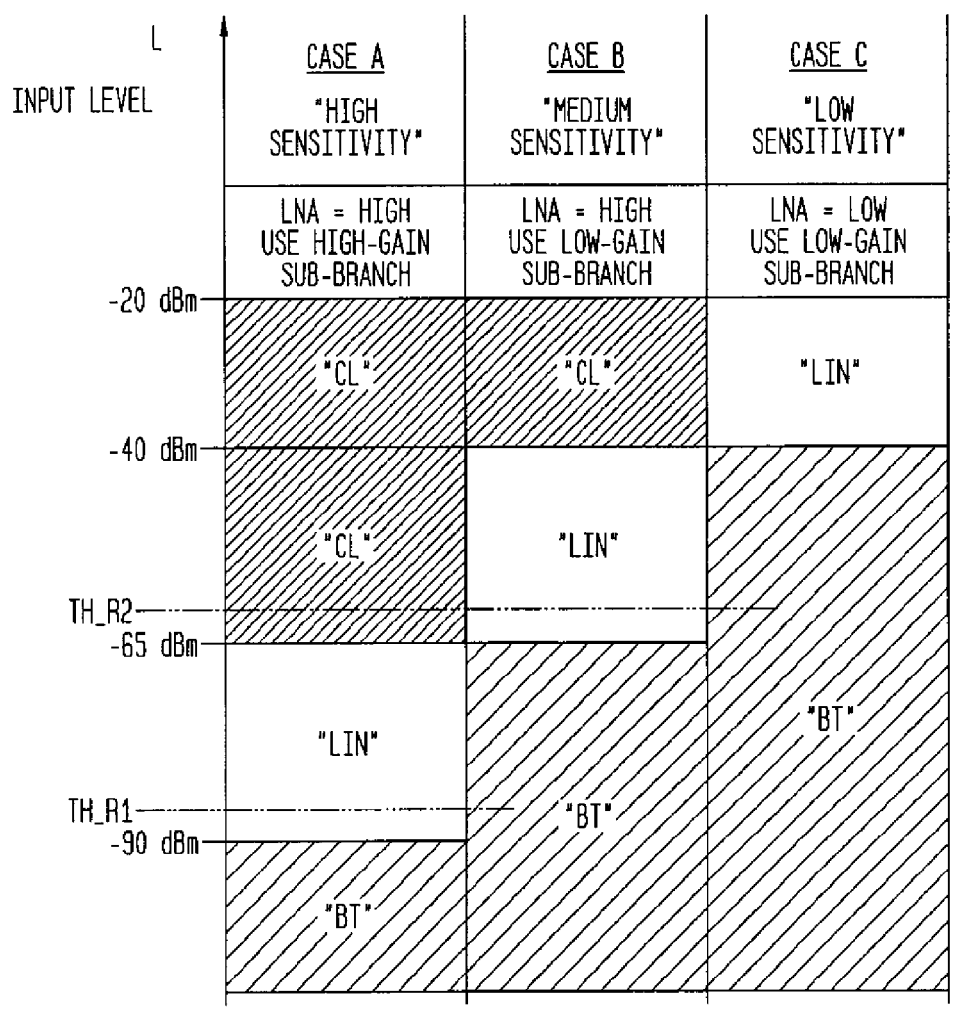
FIG. 11 shows exemplary signal-level ranges and sensitivities for the channel selection filters of FIG. 9.
Figure 12:
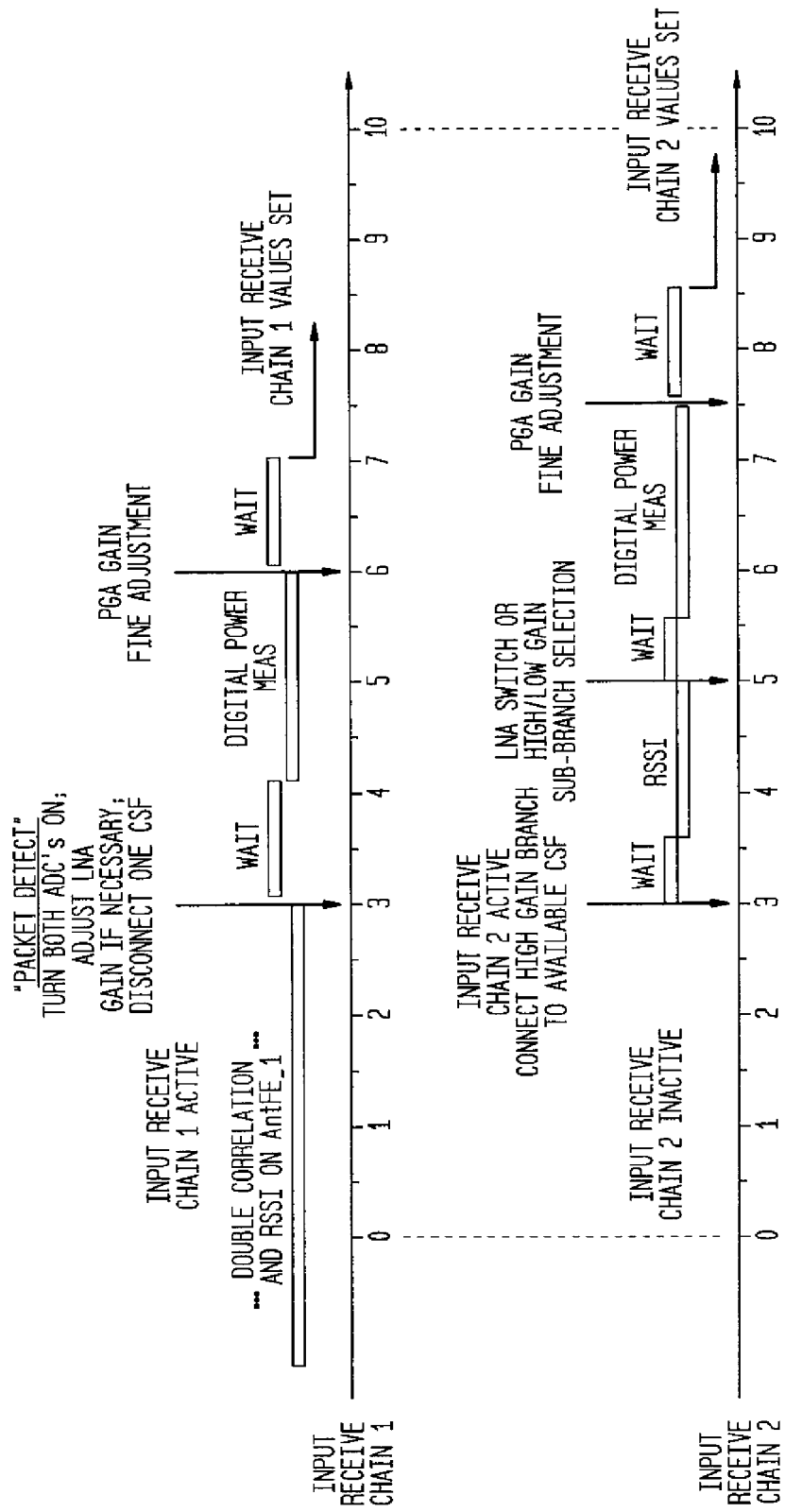
FIG. 12 shows an exemplary timing diagram for the method of FIGS. 10A and 10B.

Operation of receiver 900 to detect a WLAN 802.11a/g compliant packet, such as shown in FIG. 5, and adjust various gains during the short preamble for dual-antenna reception is now described with respect to FIGS. 10A, 10B, 11, and 12. FIGS. 10A and 10B show an exemplary method employed by receiver 900 of FIG. 9. FIG. 11 shows signal-level ranges and sensitivities for the channel selection filters of FIG. 9, and FIG. 12 shows a corresponding timing diagram for the method of FIGS. 10A and 10B, where the time axis might be measures in time increments equivalent to a symbol period.

Referring to FIG. 10A, at step 1001, receiver 900 is in idle mode. During idle mode, only one input receive chain (e.g., antenna 801(1) and RFE 802(1)) is active and operated in a sub-ranging mode. In sub-ranging mode, the output of amplifier 904(1) in high-gain sub-branch 860(1) is coupled to CSF 804(1) through switch 907 by setting switch 907 in the "a" position. The output of low-gain sub-branch 861(1) is coupled to CSF 804(2) of the second output receive chain through switch 906 by setting switch 906 in the "a" position. The gains of LNA 902(1) and SRA 904(1) are adjusted such that, regardless of the signal level of an incoming packet, the output of one of CSFs 804(1) and 804(2) is generally within the linear region of the corresponding channel selection filter's dynamic range. This gain adjustment might be determined a priori by simulation or during operation using training signals.

Referring to FIG. 11, the gains of the various components and branches are pre-adjusted in the following manner. The high-gain sub-branch of the first input receive chain of receiver 900 operates with "high sensitivity" (Case A). LNA 902(1) is set to a relatively high gain such that, for signals in the range of, for example, −90 dBm to −65 dBm generated by high-gain sub-branch 860(1), CSF 804(1) operates in its linear range. When the signal is in this range, RSSIM 909(1) of PD 908(1) produces a "LIN" (linear range) indication. For signals below −90 dBm, RSSIM 909(1) produces a "BT" (below threshold) indication, and for signals above −65 dBm, RSSIM 909(1) produces a "CL" (clipping) indication. In addition to the BT/LIN/CL indication, RSSIM 909(1) is configured to produce 1-bit information determining whether the signal is above or below a certain threshold TH_R1 (as described below). RSSI_1 and RSSI_2 of FIG. 9 include the LIN/BT/CL indication and the 1-bit threshold comparison information.

Low-gain sub-branch 861(1) is coupled to mixer 903(1) and operates with "Medium Sensitivity" (Case B of FIG. 12). Signals from mixer 903(1) are applied to CSF 804(2), and CSF 804(2) operates linearly for input signals between −65 dBm and −40 dBm. RSSIM 909(2) of PD 908(2) is similarly configured to RSSIM 909(1) and generates a BT/LIN/CL indication as well as information of whether the RSSI level is above/below threshold TH_R2.

BT/LIN/CL indications from RSSIMs 909(1) and 909(2) are employed to adjust the gain of various amplifiers, as described subsequently, and the above/below threshold (TH_R1/TH_R2) information is employed for packet detection. In addition, CORRs 910(1) and 910(2) generate a correlation value for the corresponding input signal and compare the correlation value with a corresponding threshold TH_C. Threshold TH_C is a value related to the (auto-) correlation in the signal that is expected before a signal is considered to be a packet preamble. The comparison result output from CORRs 910(1) and 910(2) is also employed for packet detection.

The choice of the pre-adjusted gains according to Cases A and B of FIG. 11 allows for signal ranges between −90 dB and −40 dBm so that, in general, at least one of the input receive chains operates in a linear range. Operation in the linear range allows for either CORR 910(1) or 910(2) to generate a correct packet detection indication (either as CORR_1 or CORR_2, respectively), and packet detection is primarily based on this packet detection indication. For relatively large signals (e.g., above −40 dBm), however, both CSFs 804(1) and 804(2) might be clipped. For this case of relatively large signals, packet detection might instead be based on the measured RSSI level (via the 1-bit threshold comparison information). Typically, the output from low-gain sub-branch 861(1) (e.g., the output of RSSIM 909(2)) with a corresponding threshold TH_R2) might be close to −40 dBm, whereas RSSIM 909(1) is inactive and its corresponding threshold comparison is null.

Thus, in cases where there is a relatively strong input signal to receiver 900, packet detection is declared based on RSSI. Otherwise, with a relatively weak input signal to receiver 900, packet detection is declared only when the periodic signal structure is detected by either of the correlators CORR 910(1) or CORR 910(2). Such operation might avoid constant triggering on "rogue" signals, which could typically be low to medium strength for non-WLAN interferers (such as microwave or cordless phone signals).

In FIG. 12, the idle mode lasts until t=3. During idle mode, PDs 908(1) and 908(2) continue to monitor the RSSI and correlation values from CSFs 804(1) and 804(2). Returning to FIG. 10A, at step 1002, detector 808, using PDs 908(1) and 908(2), measures the RSSI and generates a correlation value for the output of each of CSFs 804(1) and 804(2).

At step 1003, a test compares each of the RSSI and correlation values with its corresponding threshold. If the test of step 1003 determines that none of the RSSI and correlation values exceeds its corresponding threshold, then the method returns to step 1002 to continue monitoring the channel selection filter output signal levels. If the test of step 1003 determines that one or more of the RSSI and correlation values exceeds its corresponding threshold, then the method advances to step 1004. At step 1004, detector 808 declares that a packet is present, and receiver 900 changes to coarse-adjustment mode.

In FIG. 12, at t=3, packet detection is declared and receiver 900 transitions to coarse-adjustment mode. In coarse-adjustment mode, the inactive input receive chain (e.g., antenna 801(2) and RFE 802(2)) is changed to active. The output of RFE 802(2) is coupled to the input of the channel selection filter (i.e., one of CSFs 804(1) and 804(2)) whose corresponding packet detector (i.e., PD (908(1) or 908(2)) did not detect the presence of the packet (e.g., the channel selection filter that was in either a "clipped" or a "below threshold" state) during idle mode. However, the output of RFE 802(2) might also be operated in a sub-ranging manner. Consequently, the output of RFE 802(2) that is coupled to one of CSFs 804(1) and 804(2) is selected from either a high-gain sub-branch (e.g., from SRA 904(2)) or a low-gain sub-branch (e.g., from mixer 903(2)).

Various methods might be employed to select either high-gain sub-branch 860(2) or low-gain sub-branch 861(2) of RFE 802(2). For example, one might measure the output signal of each of the high-gain and low-gain sub-branches with an RSSI module and compare the signal levels with a threshold. Alternatively, the low-gain and high-gain sub-branches might be alternately coupled to the channel selection filter and the output of the channel selection filter monitored for clipping or below threshold states. One exemplary method of selecting either the high-gain or low-gain branch of RFE 802(2) is described subsequently for a specific embodiment in which the low-gain sub-branch is coupled first, gains are adjusted, and then the output of either the high-gain or low-gain sub-branch is selected. Further gain adjustment of LNAs 902(1) and 902(2) and fine gain adjustment of PGAs 805(1) and 805(2) are described for this specific embodiment.

Returning to FIG. 10A, once the packet is detected at step 1004, both ADCs 806(1) and 806(2) are enabled, and the second input receive chain (antenna 801(2) and RFE 802(2)) is activated. Both first and second input receive chain gains (e.g., gains of LNAs 902(1) and 902(2), SRAs 904(1) and 904(2), and PGAs 805(1) and 805(2)) are subsequently adjusted as described below to allow linear operation when receiving signals of both antennas 801(1) and 801(2).

At step 1005, a test determines whether the RSSI level RSSI_2 from RSSIM 909(2) (corresponding to low-gain sub-branch 861(1)) is clipped (=CL). If the test of step 1005 determines that RSSI_2 is clipped, then the signal has relatively strong signal power at antenna 801(1) (e.g., greater than −40 dBm). Then, at step 1006, the gain of LNA 902(1) is set to "low" gain. At step 1009, the signal of low-gain sub-branch 861(1) is employed as the output signal from RFE 802(1), which is coupled to CSF 804(2) by no change to SW 906 (remains set to position "a"). CSF 804(1) is coupled to RFE 802(2) by setting switch 907 to position "b" and switch 905 to position "b" to select low-gain sub-branch 861(2) of RFE 802(2). The gains for RFE 802(1) (processed through CSF 804(2)) are set for "low sensitivity", as shown in Case C of FIG. 11 to have linear operation for signals stronger than −40 dBm.

If the test of step 1005 determines that RSSI_2 is not clipped, then the method advances to step 1007. At step 1007, a test determines whether the value RSSI_1 of RSSIM 909(1) is clipped (=CL). If the test of step 1007 determines that RSSI_1 is clipped, then the method advances to step 1009, described above (the gain of LNA 901(1) is maintained as a relatively high gain). From step 1009, the method advances to step 1010.

If the test of step 1007 determines that RSSI_1 is not clipped, then the value of RSSI_2 is below "BT" (the value of RSSI_1 is "LIN", e.g., for signals between −90 dBm and −65 dBm) and the method advances to step 1008. At step 1008, low-gain sub-branch 861(2) of RFE 802(2) is coupled to CSF 804(2) by setting switch 905 to position "b" and switch 906 to position "b". High-gain sub-branch 860(1) of RFE 802(1) is currently employed (i.e., the output of SRA 904(1) is coupled to CSF 804(1)), since switch 907 is currently set to position "a" from idle mode. From step 1008, the method advances to step 1010.

In both steps 1008 and 1009, low-gain sub-branch 861(2) of the second input receive chain (i.e., RFE 802(2)) is initially connected to whichever one of CSFs 804(1) and 804(2) becomes available when the method transitions from idle mode to coarse-detention mode. From either step 1008 or 1009, the method advances to step 1010 to enter fine-adjustment mode (shown as occurring at time t=6 in FIG. 12). Thus, the transition from coarse-adjustment mode to fine-adjustment mode occurs after initial gain adjustment and switch setting. Various circuit components might require time to adjust, or settle, in response to the configuration changes in fine-adjustment mode. Therefore, "wait" periods might be utilized after the first round of gain adjustment, switching, and ADC activation ("turn-on") before further processing of the packet. For the exemplary embodiment described herein, these wait periods are indicated in multiples of T=0.8 μs, which is the duration of each period of the short preamble shown in FIG. 5.

Referring to FIG. 10B, from step 1010, the method advances to two processing sequences 1050 and 1060. Processing sequence 1050 comprises steps performed for the first input receive chain, and processing sequence 1060 comprises steps performed for the second input receive chain.

In processing sequence 1050, at step 1020, the method waits approximately 1.0 T for the ADC (either ADC 806(1) or 806(2), depending on which of CSFs 804(1) and 804(2) is connected to RFE 802(1)) to settle. The time period T might be equivalent to the symbol period of the received signal. At step 1021, the processor (e.g., processor 807 of FIG. 8) processes digital samples (either SAMP_1 or SAMP_2) from the corresponding ADC for a duration of 2 T for an accurate signal power estimate. At step 1022, the signal power estimate is employed to adjust the gain of the corresponding PGA (either PGA 805(1) or PGA 805(2)) to allow use of the ADC's full dynamic range. At step 1023, the method waits approximately 1.0 T, and, at step 1024, the first input receive chain is in a settled state and ready for packet reception.

In processing sequence 1060, at step 1030, the method waits approximately 0.5 T. Then, at step 1031, an RSSI level is measured (by either RSSIM 909(1) or 909(2), depending on which of CSFs 804(1) and 804(2) is connected to RFE 802(2)) to get a coarse estimate of the output signal power level of antenna 801(2). This RSSI level measurement might take approximately 1.5 T. Since the low-gain sub-branch is initially employed for the output signal of RFE 802(2) (medium sensitivity, Case B in FIG. 11), the measurement of step 1031 is sufficient for a coarse gain adjustment. At step 1032, a test determines if the RSSI level of step 1031 is CL, LIN, or BT.

If the test of step 1032 determines that the RSSI level is CL, then the signal from antenna 801(2) is, for example, above about −40 dBm. Thus, at step 1033, the gain of LNA 902(2) is adjusted to low gain. From step 1033, the method advances to step 1036. If the test of step 1032 determines that the RSSI level is "BT", then the high-gain sub-ranging branch of RFE 802(2) is employed for a weak signal. Thus, at step 1035, the position of switch 905 is set to position "a". From step 1035, the method advances to step 1036. If the test of step 1032 determines that the RSSI level is "LIN", no further coarse gain adjustment is necessary in the front-end and the method advances to step 1036.

Figure 13:
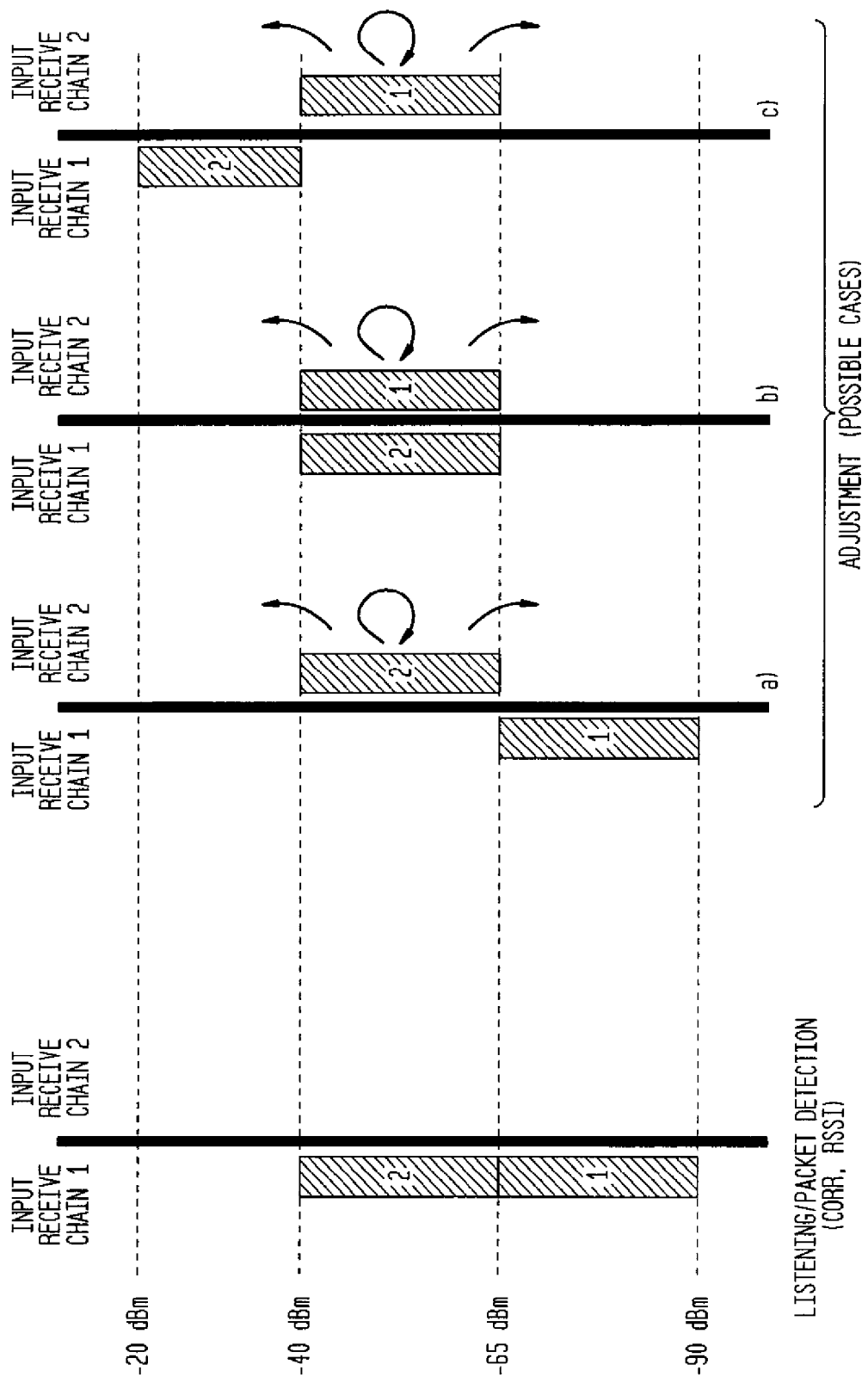
FIG. 13 illustrates the coarse signal-level adjustments for the first and second input receive chains in listening, coarse-detection, and fine-adjustment modes for the method of FIG. 9.

FIG. 13 illustrates the coarse signal level adjustments for the first and second input receive chains in listening, coarse-detection, and fine-adjustment modes. The adjustments for steps 1033 and 1035 are shown by arrows in cases a), b), and c): depending on the corresponding coarse signal level adjustment, the dynamic range for the CSF (indicated as either "1" or "2" in FIG. 13) coupled to the corresponding RFE is selected as unchanged (e.g., −65 dBm to −40 dBmn), covering higher signal levels (e.g., >−40 dBm), or lower signal levels (e.g., −90 to −65 dBm).

Returning to FIG. 10B, at step 1036, the method waits for approximately 0.5 T. At step 1037, the processor (e.g., processor 807 of FIG. 8) processes digital samples (either SAMP_1 or SAMP_2) from the corresponding ADC for a duration of 2 T for an accurate signal power estimate. At step 1038, the signal power estimate is employed to adjust the gain of the corresponding PGA (either PGA 805(1) or PGA 805(2)) to allow use of the corresponding ADC's full dynamic range. At step 1039, the method waits for approximately 1.0 T. Then, at step 1040, the first input receive chain is in a settled state and ready for packet reception in reception mode. During reception mode, the receiver receives the packet through a path defined by the input receive chain and output receive chain coupled by the switch. This path is defined by the process of switch setting and gain adjustment during the coarse- and fine-adjustment modes. Once in reception mode, the processor receives the sampled signal corresponding to the received, demodulated signal and applies various signal processing to detect the transmitted symbols and decode the detected symbols into received user data.

While the present invention has been described herein for input receive chains having two sub-ranging branches, each coupled to a corresponding channels selection filter by a switch, the present invention is not so limited. As an advantage of using sub-ranging branches, the present invention allows for reduction in the required dynamic range of each channel selection filter. Thus, one skilled in the art might extend the teachings herein to three or more sub-ranging branches, each coupled to a corresponding channel selection filter during gain adjustment, to allow for further reduction in the required dynamic range of the channel selection filter and/or finer resolution in gain adjustment since each sub-ranging branch has a corresponding range of applied signal gain.

As mentioned previously, the preamble of the packet received is employed during adjustment mode. For the exemplary embodiment described with respect to FIGS. 8-13, the preamble might conform to the IEEE 802.11g/a preamble. FIG. 14A illustrates a conventional 802.11g/a preamble and data format similar to that of FIG. 5 that may be employed for OFDM systems. The preamble of FIG. 14A may be employed where a single transmit antenna is employed and either a single receive antenna (SISO system) or multiple receive antennas (SIMO system) are used. In the conventional format of FIG. 14A, the OFDM preamble format comprises transmitting 52 parallel "tones" (sub-carriers) covering approximately 17 MHz. For the data-carrying (payload) section of each packet, each sub-carrier carries a part of the information that is contained in the phase and amplitude of each sub-carrier during a period of 4 μs. For the short preamble, the format is slightly different. The short preamble exhibits a periodicity of 0.8 μs based on transmitting only every fourth sub-carrier.

If a receiver operating in accordance with one or more embodiments of the present invention is employed in a SISO or SIMO system where the transmitter operates in accordance with the 802.11a/g standard, the receiver uses two (or more) antenna receive chains to receive multiple versions of the packet. Better packet reception performance and reliability is achieved by combining the information from the two receive chains. For this system, the receiver operating in accordance with an embodiment of the present invention processes the conventional preamble format as shown in FIG. 14A.

For a MIMO system, transmitting the same preamble (e.g., according to 802.11a/g) from the two different transmit antennas might not be preferred. The signal received at each one of the receive antennas might appear to the receiver as if the signal were transmitted from a single transmit antenna. Consequently, the short preamble might be modified so that, in the MIMO case, the short preamble transmitted simultaneously from the two transmit antennas appears differently on the two receiver antennas. Two exemplary formats for a MIMO short preamble (MIMO V1 and MIMO V2) are shown in FIGS. 14B and 14C, respectively. For the exemplary MIMO format shown in FIG. 14B, original sub-carriers (every fourth) of the conventional short preamble of FIG. 14A are shared alternately between the two transmit antennas, so that each transmit antenna uses only every 8th sub-carrier. For the exemplary MIMO format shown in FIG. 14C, each transmit antenna uses only every 8th sub-carrier, but different symbols (phase, magnitudes) are employed on each sub-carrier (comparing the two transmitters) to emulate the effect of random MIMO data.

A multiple-branch wireless receiver operating in accordance with one or more embodiments of the present invention may provide the following advantages. Multiple channel selection filtering reduces the complexity and power consumption of each filtering circuit, while maintaining a relatively broad dynamic range of the receiver. In addition, the multiple receive chain structure allows for improved packet detection performance in a radio receiver.

While certain functions of blocks of the exemplary embodiments of the present invention have been described with respect to processes of circuits, the present invention is not so limited. As would be apparent to one skilled in the art, various functions of circuit elements may also be implemented in the digital domain as processing steps in a software program. Such software may be employed in, for example, a digital signal processor, micro-controller or general purpose computer.

The present invention can be embodied in the form of methods and apparatuses for practicing those methods. The present invention can also be embodied in the form of program code embodied in tangible media, such as floppy diskettes, CD-ROMs, hard drives, or any other machine-readable storage medium, wherein, when the program code is loaded into and executed by a machine, such as a computer, the machine becomes an apparatus for practicing the invention. The present invention can also be embodied in the form of program code, for example, whether stored in a storage medium, loaded into and/or executed by a machine, or transmitted over some transmission medium, such as over electrical wiring or cabling, through fiber optics, or via electromagnetic radiation, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits.

It will be further understood that various changes in the details, materials, and arrangements of the parts which have been described and illustrated in order to explain the nature of this invention may be made by those skilled in the art without departing from the principle and scope of the invention as expressed in the following claims.

What is claimed is:

1. Apparatus for detecting a data pattern from a plurality of received signals, the apparatus comprising:
   two or more radio front ends, each radio front end adapted to generate in parallel first-gain and second-gain output signals from a corresponding one of the plurality of received signals;
   two or more channel selection filters (CSFs), each CSF adapted to filter either the first-gain output signal or the second-gain output signal to pass a corresponding information channel signal;
   a detector coupled to each of the corresponding ones of the CSFs and adapted to detect a presence of the data pattern; and
   a switch adapted to selectively couple one or more of the first-gain and second-gain output signals of the two or more radio front ends to one or more corresponding CSFs based on the detected presence or absence of the data pattern and the state of each CSF;
   wherein:
   the switch selectively couples one or more of the first-gain and second-gain output signals of the two or more radio front ends based on an idle mode or an adjustment mode,
   the detector is adapted to determine the idle mode or the adjustment mode based on at least one of the detected presence of the data pattern and a state of each CSF, and
   the detector comprises a correlator adapted to detect the data pattern and a signal level detector adapted to detect the state of the CSF.

2. The invention as recited in claim 1, wherein:
   during the idle mode, the switch couples first radio front end first-gain and second-gain output signals to corresponding CSFs to provide first and second CSF output signals, and during the adjustment mode, i) either a first radio front end second-gain output signal or a first radio front end first-gain output signal from the corresponding CSF is selected as the first CSF output signal based on the state of each CSF; ii) the switch couples either a first-gain or a second-gain output signal of a second radio front end to a corresponding CSF to provide the second CSF output signal; and iii) gain of the first and second radio front ends is adjusted based on the states of the CSFs.

3. The invention as recited in claim 2, wherein, during the adjustment mode, the gain of the first and second radio front ends is adjusted so as to substantially maintain at least one of the corresponding first-gain and second-gain output signals within a dynamic range of the corresponding CSF.

4. The invention as recited in claim 3, wherein, following the adjustment mode, the apparatus is in reception mode.

5. The invention as recited in claim 4, further comprising a processor adapted to i) receive, from each CSF a filtered signal and ii) detect, in reception mode, user data symbols from each filtered signal.

6. The invention as recited in claim 5, further comprising a decoder adapted to decode the user data symbols into user information.

7. The invention as recited in claim 3, wherein the dynamic range of each CSF is selected based on a range of gain for either the first-gain output signal or the second-gain output signal.

8. The invention as recited in claim 1, wherein the data pattern conforms to a portion of an orthogonal frequency division multiplex (OFDM) packet from a OFDM transmitter, the OFDM transmitter transmitting the set of sub-carriers in parallel.

9. The invention as recited in claim 8, wherein the data pattern is a short preamble with periodicity based on transmitting only every fourth sub-carrier.

10. The invention as recited in claim 8, wherein the data pattern is a short preamble with periodicity based on transmitting every fourth sub-carrier alternately between transmitter antennas.

11. The invention as recited in claim 8, wherein the data pattern is a short preamble with periodicity based on transmitting every 8th sub-carrier.

12. The invention as recited in claim 1, wherein the data pattern comprises a repeating pattern and the correlator detects the presence of the data pattern with an auto-correlation operation on the output signal of the CSF based on the repeating pattern.

13. The invention as recited in claim 1, wherein the state of the CSF comprises signal level information and an operation state of the CSF.

14. The invention as recited in claim 13, wherein the operation state of the CSF comprises a below threshold state, a linear range state, and a clipped state.

15. The invention as recited in claim 13, wherein, when the detector detects the presence of the data pattern, the operation state of the CSF is employed to adjust the gain of each radio front end.

16. The invention as recited in claim 13, wherein the signal level information is employed to detect the presence of a packet when the operation state of each CSF is not in a linear range state.

17. The invention as recited in claim 13, wherein the apparatus is further configured to operate in a fine adjustment mode and, during fine adjustment mode, the signal level information is employed to select a gain for each output signal provided by a CSF.

18. The invention as recited in claim 17, wherein the gain selected for each output signal provided by a CSF is based on a dynamic range of a corresponding analog-to-digital converter coupled to the CSF.

19. The invention as recited in claim 1, further comprising two or more output receive chains, each one of the output receive chains including a corresponding one of the CSFs and further comprising i) an amplifier adapted to adjust the gain of the CSF output signal and ii) a analog-to-digital converter (ADC) adapted to convert the gain-adjusted signal of the amplifier to a set of samples, wherein:
the first and second CSF output signals are adjusted by the amplifier of the corresponding output receive chain so as to substantially maintain the CSF output signal within a dynamic range of the corresponding ADC.

20. The invention as recited in claim 19, wherein the apparatus is further configured to operate in a fine-adjustment mode and, during fine-adjustment mode, the signal level information is employed to select a gain of each radio front end and a gain of each output receive chain.

21. The invention as recited in claim 1, wherein the data pattern is a portion of a packet, and the apparatus further comprises a processor adapted to decode the packet based on the signal from each CSF.

22. The invention as recited in claim 1, wherein the circuit is embodied in an integrated circuit (IC).

23. The invention as recited in claim 22, wherein the IC is embodied in a receiver operating in accordance with an IEEE 802.11 standard for orthogonal frequency division multiplex wireless local area networks.

24. The invention as recited in claim 1, wherein one or more radio front ends further comprises a corresponding antenna.

25. A method of detecting data of a packet from a plurality of received signals, the method comprising the steps of:
(a) generating in parallel, during idle mode in a first radio front end, a first-gain output signal and a second-gain output signal from one of the plurality of received signals;
(b) applying a channel selection filter (CSF) to each of the second-gain and first-gain output signals to generate filtered second-gain and first-gain output signals; and
(c) detecting the presence of a data pattern in at least one of the filtered second-gain and first-gain output signals, wherein, if the presence of the data pattern is detected,
(c1) selecting, as an output from the first radio front end, either the filtered second-gain output signal or the filtered first-gain output signal;
wherein:
substep (c1) comprises selectively coupling one or more of the first-gain and second-gain output signals of the two or more radio front ends based on an idle mode or an adjustment mode, and
step (c) comprises:
determining the idle mode or the adjustment mode based on at least one of the detected presence of the data pattern and a state of each CSF, and
using a correlator to detect the data pattern and a signal level detector to detect the state of the CSF.

26. The invention as recited in claim 25, wherein step (c) further comprises the steps of:
(c2) applying, in adjustment mode, a CSF to an output signal of a second radio front end;
(c2) measuring a state of the corresponding output signal of each CSF;
(c3) adjusting the gain of the first and second radio front ends based on the measured states of the CSFs.

27. The invention as recited in claim 26, wherein:

during the idle mode, step (c) couples first radio front end first-gain and second-gain output signals to corresponding CSFs to provide first and second CSF output signals, and during the adjustment mode, step (c) i) selects either a first radio front end second-gain output signal or a first radio front end first-gain output signal from the corresponding CSF as the first CSF output signal based on the state of each CSF; ii) couples either a first-gain or a second-gain output signal of a second radio front end to a corresponding CSF to provide the second CSF output signal; and iii) adjusts gain of the first and second radio front ends based on the states of the CSFs.

28. Apparatus for receiving user data comprising:

two or more radio front ends, each radio front end adapted to generate in parallel first-gain and second-gain output signals from a corresponding one of the plurality of received signals;

two or more channel selection filters (CSFs), each CSF adapted to filter either a first-gain output signal or a second-gain output signal to pass a corresponding information channel signal;

a detector coupled to each of the corresponding ones of the channel selection filters and adapted to i) detect a presence of the data pattern and ii) determine a state of each CSF;

a switch adapted to selectively couple one or more of the first-gain and second-gain output signals of the two or more radio front ends to one or more corresponding CSFs based on the detected presence or absence of the data pattern and the state of each CSF; and a processor adapted to detect a symbol sequence from the output signal of each CSF;

wherein:

the switch selectively couples one or more of the first-gain and second-gain output signals of the two or more radio front ends based on an idle mode or an adjustment mode, the detector is adapted to determine the idle mode or the adjustment mode based on at least one of the detected presence of the data pattern and a state of each CSF, and the detector comprises a correlator adapted to detect the data pattern and a signal level detector adapted to detect the state of the CSF.

29. The invention as recited in claim 28, wherein the processor is further adapted to decode the symbol sequence into the user data.

30. A method of detecting a data pattern from a plurality of received signals, the method comprising the steps of:

a) generating in parallel, for each of two or more radio front ends, first-gain and second-gain output signals from a corresponding one of the plurality of received signals;

b) filtering, with an associated one of two or more channel selection filters (CSFs), either a first-gain output signal or a second-gain output signal to pass a corresponding information channel signal;

c) detecting, a presence of the data pattern at the output of one of the CSFs; and d) selectively coupling one or more of the first-gain and second-gain output signals of the two or more radio front ends to one or more corresponding CSFs based on the detected presence or absence of the data pattern;

wherein:

step (d) comprises selectively coupling one or more of the first-gain and second-gain output signals of the two or more radio front ends based on an idle mode or an adjustment mode, wherein the idle mode or the adjustment mode is determined based on at least one of the detected presence of the data pattern and a state of each CSF, and a correlator is used to detect the data pattern, and a signal level detector is used to detect the state of the CSF.

* * * * *